United States Patent
Oshemkov et al.

(10) Patent No.: US 9,690,191 B2
(45) Date of Patent: Jun. 27, 2017

(54) SURFACE DEFECT REPAIR BY IRRADIATION

(71) Applicant: Carl Zeiss SMS Ltd., Karmiel (IL)

(72) Inventors: Sergey Oshemkov, Karmiel (IL); Vladimir Kruglyakov, Migdal Haemek (IL)

(73) Assignee: Carl Zeiss SMS Ltd., Karmiel (IL)

( * ) Notice: Subject to any disclaimer, the term of this patent is extended or adjusted under 35 U.S.C. 154(b) by 80 days.

(21) Appl. No.: 14/767,263

(22) PCT Filed: Feb. 17, 2014

(86) PCT No.: PCT/IL2014/050169
§ 371 (c)(1),
(2) Date: Aug. 11, 2015

(87) PCT Pub. No.: WO2014/125494
PCT Pub. Date: Aug. 21, 2014

(65) Prior Publication Data
US 2016/0004151 A1  Jan. 7, 2016

Related U.S. Application Data

(60) Provisional application No. 61/765,730, filed on Feb. 17, 2013.

(51) Int. Cl.
*G03F 1/72* (2012.01)
*G03F 1/24* (2012.01)
*B82Y 10/00* (2011.01)
*B82Y 40/00* (2011.01)

(52) U.S. Cl.
CPC .............. *G03F 1/72* (2013.01); *B82Y 10/00* (2013.01); *B82Y 40/00* (2013.01); *G03F 1/24* (2013.01)

(58) Field of Classification Search
CPC ........................................................ G03F 1/72
USPC .............................................................. 430/5
See application file for complete search history.

(56) References Cited

U.S. PATENT DOCUMENTS

2004/0175631 A1 * 9/2004 Crocker ................. B82Y 10/00
                                                                        430/5
2009/0286166 A1   11/2009 Sugiyama et al.

FOREIGN PATENT DOCUMENTS

| WO | WO 03/026481   | 4/2003 |               |
|----|----------------|--------|---------------|
| WO | WO 2004/038504 | 5/2004 | ...... G03F 7/00 |
| WO | WO 2012/103933 | 8/2012 | ...... B23K 26/00 |

OTHER PUBLICATIONS

The International Search Report for International Application No. PCT/IL2014/050169 dated Jun. 23, 2014.
Onal et al., "Automated 2-D Nanoparticle Manipulation with an Atomic Force Microscope", 2009 IEEE International Conference on Robotics and Automation, Kobe International Conference Center, Kobe, Japan, pp. 1814-1819 (May 12-17, 2009).

\* cited by examiner

*Primary Examiner* — Stephen Rosasco
(74) *Attorney, Agent, or Firm* — Fish & Richardson P.C.

(57) ABSTRACT

A method for repairing a defect on a substrate surface includes placing on the defect a nanoparticle that includes a conductive material. A region of the substrate surface in which the nanoparticle is placed is irradiated, the region being larger than the nanoparticle. An energy density of the irradiation is below a modification threshold for the substrate surface.

22 Claims, 5 Drawing Sheets

SURFACE DEFECT REPAIR BY IRRADIATION

CROSS-REFERENCE TO RELATED APPLICATIONS

This application is a U.S. national stage application of PCT application PCT/IL2014/050169, filed on Feb. 17, 2014, which claims the benefit of U.S. provisional patent application 61/765,730, filed on Feb. 17, 2013. The entire contents of the above applications are herein incorporated by reference.

FIELD OF THE INVENTION

The present invention relates to repairing defects of surfaces. More particularly, the present invention relates to surface defect repair using irradiation.

BACKGROUND OF THE INVENTION

Density of components on integrated circuits is constantly increasing in the semiconductor industry. As a result of the increase, masks used in photolithography are required to project structures of ever decreasing size onto a photoresist layer on a wafer. The wavelength of the radiation used in exposure of the photolithographic masks must be sufficiently short in order to meet this requirement. Typical exposure wavelengths have been shifted into the far ultraviolet region of the electromagnetic spectrum. Typically at present, a wavelength of 193 nm deep ultraviolet (DUV) radiations is used for the exposure of the photoresist on wafers. In some cases, wavelengths in the extreme ultraviolet (EUV) range of the electromagnetic spectrum (e.g., 13.5 nm) are used. The complexity of the manufacture of photolithographic masks with increased resolution is increasing together with the expense.

Photolithographic masks are expected to conform to stringent demands and tolerances with respect to transmission homogeneity, planarity, purity, and temperature stability. For example, the tolerable deviation of a mask substrate from planarity is only a fraction of the exposure wavelength. Larger deviations may significantly disturb the phase front of the electromagnetic wave reflected from a multilayer structure on a surface of the substrate. Deviations of the planarity of the substrate of the photolithographic mask may lead to variations of the optical intensity distribution on the photoresist due to constructive or destructive interference. During further processing of the wafer, the variations in optical intensity may result in defective fabrication of semiconductor devices.

Decreasing exposure wavelength makes this problem more challenging. For example, with EUV radiation the allowed deviation is on the order of nanometers. A substrate as supplied by a manufacturer may not meet the planarity requirements for EUV photolithographic masks. The process of fabricating the mask, which includes formation of fine patterns on a surface of the substrate, may cause further deterioration of the planarity of the substrate surface.

In addition, a curvature of the substrate of a photolithographic mask may lead to imaging errors of the mask.

SUMMARY OF THE INVENTION

There is thus provided, in accordance with some embodiments of the present invention, a method for repairing a defect on a substrate surface, the method including: placing on the defect a nanoparticle including a conductive material; irradiating a region of the substrate surface in which the nanoparticle is placed, the region being larger than the nanoparticle, an energy density of the irradiation being below a modification threshold for the substrate surface.

Furthermore, in accordance with some embodiments of the present invention, the conductive material includes gold.

Furthermore, in accordance with some embodiments of the present invention, the method includes measuring a position of the defect and wherein placing the nanoparticle includes placing the nanoparticle at the measured position of the defect.

Furthermore, in accordance with some embodiments of the present invention, measuring the position of the defect includes optical scanning of the substrate surface.

Furthermore, in accordance with some embodiments of the present invention, placing the nanoparticle includes manipulating the nanoparticle using an atomic force microscope device.

Furthermore, in accordance with some embodiments of the present invention, placing the nanoparticle includes selecting a size of the nanoparticle in accordance with a measured size of the defect or in accordance with a wavelength of the irradiation.

Furthermore, in accordance with some embodiments of the present invention, a lateral dimension of the nanoparticle is no larger than a lateral dimension of the defect.

Furthermore, in accordance with some embodiments of the present invention, the coated substrate includes a photolithography mask substrate or an unpatterned multilayer lithography mask.

Furthermore, in accordance with some embodiments of the present invention, the irradiation includes pulsed laser radiation.

Furthermore, in accordance with some embodiments of the present invention, a duration of a pulse of the radiation is less than 100 femtoseconds.

Furthermore, in accordance with some embodiments of the present invention, a pulse energy density of the irradiation is below the modification threshold.

Furthermore, in accordance with some embodiments of the present invention, a spot diameter of the irradiation is at least ten times larger than a lateral dimension of the nanoparticle.

Furthermore, in accordance with some embodiments of the present invention, a wavelength of the irradiation is selected in accordance with a resonance frequency of a plasma oscillation in the nanoparticle.

Furthermore, in accordance with some embodiments of the present invention, the method includes removing the nanoparticle from the substrate surface.

Furthermore, in accordance with some embodiments of the present invention, removing the nanoparticle includes manipulation using an atomic force microscope device.

There is further provided, in accordance with some embodiments of the present invention, a system for repairing a defect on a substrate surface, the system including: a placement device for placing a nanoparticle at a location on the substrate surface; and an irradiation device controllable to direct radiation from a radiation source to a region of the substrate surface on which the nanoparticle is placed, the region being larger than the nanoparticle, and an energy density of the radiation being below a modification threshold for the substrate surface.

Furthermore, in accordance with some embodiments of the present invention, the radiation source includes a pulsed laser radiation source to produce pulses of the radiation, wherein a duration of each of the pulses is less than 100 femtoseconds.

Furthermore, in accordance with some embodiments of the present invention, optics or a stage of the irradiation device is controllable to scan a beam of the radiation across the substrate surface.

Furthermore, in accordance with some embodiments of the present invention, a diameter of an irradiation spot of the beam is at least ten times larger than a lateral dimension of the nanoparticle.

Furthermore, in accordance with some embodiments of the present invention, the placement device includes an atomic force microscope device.

BRIEF DESCRIPTION OF THE DRAWINGS

In order to better understand the present invention, and appreciate its practical applications, the following Figures are provided and referenced hereafter. It should be noted that the Figures are given as examples only and in no way limit the scope of the invention. Like components are denoted by like reference numerals.

DETAILED DESCRIPTION OF THE INVENTION

Figure 1:
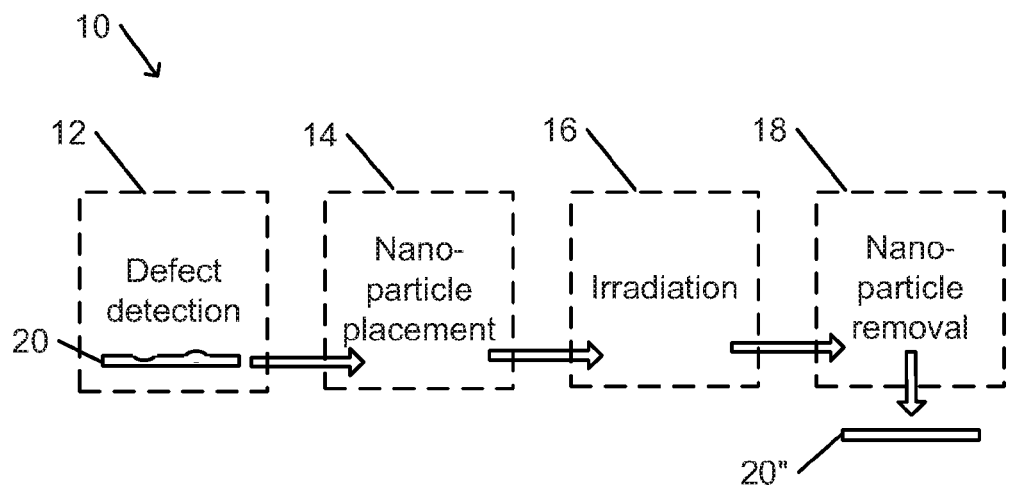
FIG. 1 schematically illustrates a system for surface defect repair, in accordance with an embodiment of the present invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Embodiments of the invention may include an article such as a computer or processor readable medium, or a computer or processor storage medium, such as for example a memory, a disk drive, or a USB flash memory, encoding, including or storing instructions, e.g., computer-executable instructions, which when executed by a processor or controller, carry out methods disclosed herein.

In accordance with embodiments of the present invention, a nanometer-scale defect of a surface of a dielectric material or object may be corrected or repaired. In particular, embodiments of the present invention may be applied to repair defects on a surface of dielectric intended for use as a substrate of a photolithography mask. However, embodiments of the present invention may be applied to repair defects on other dielectric surfaces. Reference herein to a substrate, unless indicated otherwise, should be understood as referring to any such dielectric surface or object, or another surface or object in which defects may be repaired as described herein.

As used herein, a surface defect refers to a local deviation from flatness or planarity of the substrate surface (e.g., referring to a portion of the surface but not to an overall curvature of the surface as a whole). A deviation may take the form of a local indentation, depression, pit, groove, valley, or other concave deviation from flatness in the substrate surface. A deviation may take the form of a local protuberance, projection, bump, hill, or other convex deviation from flatness that extends from the substrate surface. Other defects (e.g., undulations or wrinkles in the surface) may be described as adjacent or neighboring indentations and protuberances. The surface defect may have nanometer-scale dimensions, while the entire substrate surface may have dimensions measured in millimeters.

Repair of a defect, as used herein, refers to correction of the surface at the deviation such that the surface in the region of the defect becomes coplanar with the surrounding surface. Repair of the defect may also refer to reducing a deviation from co-planarity of the surface at the defect. For example, a defect may be characterized by a perpendicular distance of a point within the defect and a plane of the surface surrounding the defect. This distance is referred to herein as a depth or height of the defect. A defect may be considered to be a nanometer-scale defect if its height or depth is in the range from a few nanometers (e.g., one or more) to a few tens of nanometers (e.g., less than 100 nm). The width or length of a nanometer-scale defect (e.g., in a plane that is substantially parallel to a plane of the surface) may range up to tens of nanometers (e.g., up to 100 nm), or more.

The defect may be considered herein to be repaired if the height or depth of the defect is reduced. For example, a defect may be considered to be repaired if the depth of an indentation or the height of a protuberance is reduced. The terms "height" and "depth" of a defect may be used interchangeably herein.

Application of one or more defect detection techniques may be applied to the substrate surface in order to determine the existence of, and the location of, a defect. For example, an optical defect detection technique may be applied. An optical technique may include detection of scattering of a narrow scanned laser beam when the beam hits a defect. Analysis of the scattered light may indicate a location of the defect in an appropriate coordinate system. One or more fiduciary marks, landmarks, or other features of the substrate surface, or a stage on which the substrate is placed or held, may be utilized in determining (e.g., an origin and axes of) the coordinate system. As another example, atomic force microscopy (AFM), or another microscopy technique suitable for detecting a nanometer-sized defect, may be applied to determine a location of a defect.

In accordance with embodiments of the present invention, a conducting (e.g., metallic) nanometer-scale particle (e.g., with dimensions up to 500 nm), herein referred to as a nanoparticle, is placed on the defect. For example, the conducting nanoparticle may be placed at a location (e.g., as specified in a coordinate system that is common to a defect detection device and a nanoparticle placement device) on the substrate surface that had previously been determined by application of a defect detection technique. A conducting nanoparticle may be manipulated to the determined location using an AFM device or AFM manipulation techniques, or another technique suitable for accurate placement of a nanoparticle.

Properties of the nanoparticle may be selected or determined in consideration of a wavelength of laser radiation with which the surface is to be irradiated. For example, the conducting nanoparticle may be designed or selected so as to have a plasma oscillation resonance frequency that is close to the frequency of the laser radiation. A plasma oscillation resonance frequency may be determined by such properties as electrical conductivity, shape, and size, A lateral size or dimension of the nanoparticle (e.g., diameter, axis, length, width, or other dimension) may be selected to match a size, or estimated size, of the defect upon which the nanoparticle is placed. Properties (e.g., a size) of the nanoparticle may be selected in accordance with (e.g., as a compromise solution between) two or more conflicting requirements. For example, the nanoparticle may be selected such that a lateral dimension of the nanoparticle is not significantly larger than, or no larger than, a lateral dimension of the defect upon which the nanoparticle is to be placed. The nanoparticles may be fabricated to have a shape and size that substantially matches a shape and size of a nanometer-scale defect.

A nanoparticle may be smaller than a nanometer-scale defect. In this case, a plurality of nanoparticles may be placed on different regions of the defect to substantially cover the scale defect. Alternatively or in addition, e.g., if the defect is much larger than a single nanoparticle, nanoparticles may be placed along a perimeter of the defect in order to accurately delimit the perimeter of the defect.

For example, a conducting nanoparticle include (e.g., or may be primarily composed of) gold, silver, or another metal or conducting material. A lateral dimension of the conducting nanoparticle may be less than 0.5 micron (500 nm). A lateral dimension of the conducting nanoparticle may be less than 0.1 micron (100 nm). The lateral dimension may range between 5 nm and 100 nm. The lateral dimension may range between 15 nm and 25 nm, or between 20 nm and 200 nm. The lateral dimension may be about 20 nm.

With the nanoparticle placed on the defect, the surface that includes the defect and nanoparticle is exposed to laser radiation. The wavelength of the laser radiation may be selected in consideration of, e.g., at or near, a plasma oscillation resonance frequency of the nanoparticle. For example, a wavelength in the visible (e.g., green) spectral region of the electromagnetic spectrum may be selected for a spherical gold nanoparticle with a radius in the range of 20 nm to 100 nm. Other wavelengths may be selected for nanoparticles with other compositions, shapes, or dimensions. When the surface is irradiated with pulses of the laser radiation, the interaction of the radiation with the conducting nanoparticle may result in local heating of the region of the substrate surface (e.g., the region of a defect) upon which the nanoparticle was placed. The local heating heats the covered region of the substrate surface to a temperature that is appreciably greater under the temperature to which the remainder of the substrate surface is heated by the irradiation. The local heating of the region upon which the nanoparticle was placed may be sufficient to repair a defect (e.g., in the form of a depression or protuberance) in the substrate surface.

For example, irradiation of the conducting nanoparticle may induce an electron oscillation within the nanoparticle. The local electromagnetic field oscillation that results from the electron oscillation may be significantly greater than that of the laser beam itself. The magnified local electromagnetic field oscillation may cause local resistance heating in the region of the substrate surface that is covered by the nanoparticle. The local heating may be sufficient to cause sufficient local melting or softening of the dielectric surface to reduce or eliminate a defect in the region of the local heating. Alternatively or in addition, other mechanisms may be involved in repairing a surface defect in a region of the substrate surface upon which a conducting nanoparticle has been placed.

A beam of the laser radiation that impinges on the substrate surfaces forms a laser spot, which may be characterized by a spot diameter. Any region of the substrate surface within the spot diameter is considered to be irradiated by the laser radiation. The spot diameter may be significantly wider than a lateral dimension (e.g., diameter) of the nanoparticle. For example, the spot diameter (e.g., diameter at half maximum intensity, or another appropriately defined effective width, of the impinging radiation) may be at least 1 micron (while a lateral dimension of the nanoparticle may be less than 1 micron, less than 100 nm, or smaller). The spot diameter may exceed 5 microns or 10 microns. For example, the spot diameter may be selected to exceed a lateral dimension of the nanoparticle by at least an order of magnitude or factor of ten (e.g., spot diameter of at least 5 microns for particle lateral dimension of less than 0.5 micron, or spot diameter of at least 1 micron for particle lateral dimension of less than 100 nm).

The laser radiation may be pulsed. For example, the laser radiation may be pulsed to irradiate the substrate surface with femtosecond pulses (e.g., pulses that are no longer than 100 femtoseconds). A frequency with which a region of the substrate surface is irradiated with a femtosecond laser pulse may range from a single pulse up to a frequency of about 10 MHz. A beam of the radiation, such as the laser spot, may be scanned across the substrate surface. The energy density may be insufficient to appreciably or noticeably modify (e.g., no detectible change in surface topography or function) any part of the surface of the substrate upon which no conducting nanoparticle has been placed. Such an energy density is herein referred to as being below a modification threshold for the substrate surface. For example, the energy of each pulse may be less than a pulse energy required to modify a surface of the substrate upon which a conducting nanoparticle has not been placed (e.g., is less than the modification threshold). However, the pulse energy may be sufficient to repair a defect upon which a conducting nanoparticle has been placed.

Pulse energy density for the laser may be determined or selected in consideration of the material of the substrate and upon the local field enhancement (gain) caused by the conducting nanoparticle. For example, a typical substrate for production of a lithographic mask may be irradiated by femtosecond laser pulses with energy density in the range from about 1 mJ/cm$^2$ to about 1500 mJ/cm$^2$.

Thus, if the conducting nanoparticle falls within the spot diameter, the region covered by the nanoparticle may be locally heated. Thus, in order to repair a defect on the substrate surface, the laser beam need not be aimed precisely at the defect. The laser beam may be scanned across the substrate surface to enable all regions of the surface to be irradiated. Precise placement of the conducting nanoparticle on the defect, heating of the surface to a high temperature that enables repair of the defect may be limited to the region of the defect. Other regions of the substrate surface are not heated to the high temperature. Thus, possible melting or damage to the substrate surface (e.g., damage by disturbance of surface layers) may be avoided.

After repair of the defect, the nanoparticle may be removed. For example, a technique that was used to place the nanoparticle on the surface (e.g., AFM technique, or other technique), may be applied to remove the nanoparticle. As another example, an appropriate chemical treatment may be applied to remove (e.g., react with or dissolve) the nanoparticle while leaving the substrate surface intact.

A system may be configured for laser pulse repair of nanometer-scale surface defects in a substrate.

FIG. 1 schematically illustrates a system for surface defect repair, in accordance with an embodiment of the present invention.

Surface defect repair system 10 may includes defect detection module 12, nanoparticle placement module 14, irradiation module 16, and removal module 18. Some or all of the various modules may represent various functionality, devices, or units that are incorporated within a single device (e.g., housed within a single housing, or controlled by a single controller or by several intercommunicating controllers). Some or all of the modules may represent separate devices that are situated in a single production line (e.g., with connected or intercommunicating controllers, or with an automatic mechanism for transporting a substrate 20 from one module to the other), or that lack any physical or logical interconnection (e.g., at separate geographic locations such that a substrate 20 requires manual transport from one module to the other, or that are separately controlled). A device of one of the modules, or a component of a device of one of the modules, may be shared by another of the modules. For example, a device or component that is utilized by one module, may operated in a different manner, or in the same manner for a different purpose, by another of the modules.

Surface defect repair system 10 is configured to repair one or more surface defects on substrate 20, to produce an output substrate 20". Output substrate 20" may include one or more repaired defects. For example, a height or depth of a defect in output substrate 20" may have been reduced, or eliminated (e.g., reduced to an undetectable height or depth).

Defect detection module 12 may include a defect detection device that is configured to detect a nanometer-scale defect on a substrate surface. For example, an optical defect detection device may detect scattered radiation from a nanometer-scale surface defect. A microscope (e.g., an atomic force microscope or similar scanning device with nanometer-scale resolution) may detect a defect in the form of a nanometer-scale depression or protuberance in the substrate surface. Defect detection module 12 may measure a coordinate of the defect. For example, reference to a fiduciary mark on the substrate or a platform for holding the substrate, reference to a feature of the substrate or platform, an encoder, proximity sensor, optical tracking device, or other coordinate determination technique may be applied to determine a reference for or to define a coordinate system. One or more characteristics of the defect may be determined. For example, a size, shape, height, or other characteristic of the defect may be determined.

Nanoparticle placement module 14 is configured to place a conducting nanoparticle on the surface of substrate 20, at a location determined by defect detection module 12. Nanoparticle placement module 14 may include one or more placement devices that utilize one or more technologies to place a nanoparticle at a location of a defect or elsewhere on the surface of substrate 20.

For example, a placement device of nanoparticle placement module 14 may include an AFM device or utilize AFM technology to manipulate a conducting nanoparticle to the location of the defect. As another example, a device of nanoparticle placement module 14 may utilize electron-beam deposition techniques to deposit a nanoparticle on the substrate surface at the location of the defect.

Figure 2:
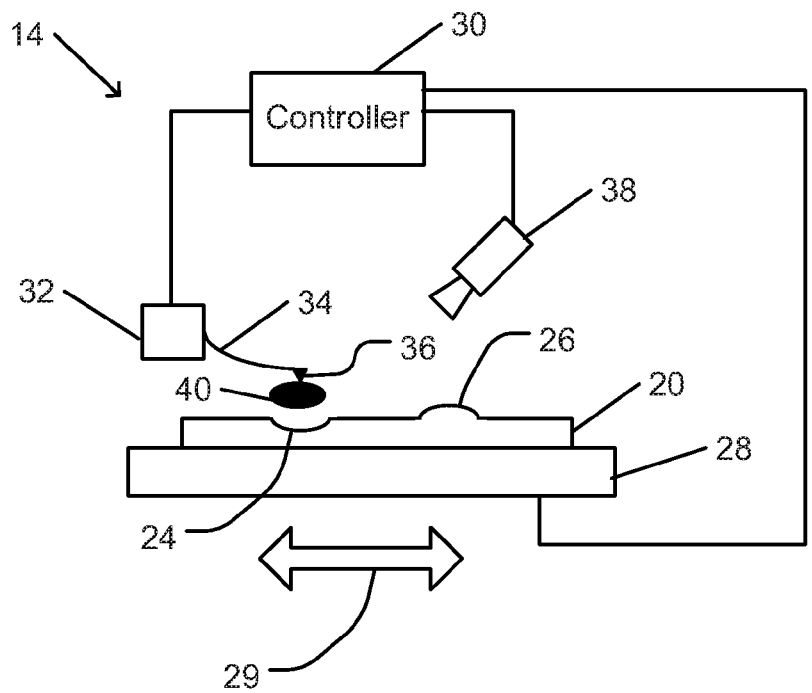
FIG. 2 schematically illustrates a nanoparticle placement module, based on atomic force microscopy technology, of the system of FIG. 1.

FIG. 2 schematically illustrates a nanoparticle placement module, based on AFM technology, of the system of FIG. 1. Reference is also made to items shown in FIG. 1.

Substrate 20 is shown with a depression defect 24 and a protuberance defect 26. For example, the locations of depression defect 24 and protuberance defect 26 may have been detected by defect detection module 12. Nanoparticle placement module 14 may be operated to place nanoparticle 40 on depression defect 24. Nanoparticle placement module 14 may also be operated to place nanoparticle 42 (shown in FIG. 3A) on protuberance defect 26. Nanoparticle 42 may be identical to, or differ in one or more characteristics from, nanoparticle 40.

Nanoparticle placement module 14 includes placement controller 30. Placement controller 30 may include a processor that is configured to operate in accordance with programmed instructions. Placement controller 30 may include or communicate with a memory, data storage device, input device, output device, or another component. Placement controller 30 may be shared with one or more other modules of surface defect repair system 10. Placement controller 30 may be operated to control one or more other components of nanoparticle placement module 14 to enable placement of nanoparticle 40 on depression defect 24. Placement controller 30 may receive data from one or more sensors or measurement devices.

For example, placement controller 30 may be operated to control, or to receive data from, one or more of AFM device 32, imaging unit 38, and stage 28.

An example of accurate AFM manipulation of a nanoparticle is described by Onal et al. in "Automated 2-D Nanoparticle Manipulation with Atomic Force Microscope," 2009 IEEE International Conference on Robotics and Manipulation, which is incorporated herein by reference. Other AFM manipulation techniques or devices may be used.

Nanoparticle placement module 14 includes AFM device 32. AFM device 32 includes cantilever arm 34. AFM device 32 may adjust a height of cantilever arm 34 above substrate 20. A distal end of cantilever arm 34 includes probe 36. Probe 36 may be used to manipulate (e.g., push or otherwise convey to a desired location) conducting nanoparticle 40. Concurrently, the position of cantilever arm 34, and forces exerted on it, may be determined by imaging unit 38. For example, imaging unit 38 may include an arrangement of one or more light sources and light detectors. Imaging unit 38 may detect deflection or bending of cantilever arm 34 in response to forces that are applied to probe 36.

Nanoparticle placement module 14 includes stage 28 for supporting substrate 20. Stage 28 may be operated to introduce relative movement between substrate 20 and probe 36, as represented by arrow 29. For example, the relative motion may be controlled by placement controller 30.

For example, AFM device 32 may be operated in a non-contact mode to accurately determine a position of nanoparticle 40 relative to depression defect 24. When operating in a non-contact mode, probe 36 does not touch substrate 20.

Nanoparticle placement module 14 may use AFM device 32 (e.g., in non-contact mode) together with imaging unit 38 to verify placement of nanoparticle 40 at the location of depression defect 24. Identical or similar methods may be used to place nanoparticle 42 on protuberance defect 26. Nanoparticle 40 or 42 may include gold or silver, or another metallic or conducting material. A size or shape of nanoparticle 40 or 42 may substantially match a size or shape of depression defect 24 or of protuberance defect 26. In some cases, a size or shape of nanoparticle 40 or 42 may match a region within depression defect 24 or protuberance defect 26. In such a case, a plurality of nanoparticles may be placed on depression defect 24 or on protuberance defect 26 to cover different regions of the defect.

After placement of nanoparticles on defects, e.g., placement of nanoparticle 40 on depression defect 24 or of nanoparticle 42 on protuberance defect 26, irradiation module 16 may be operated to irradiate substrate 20.

Figure 3A:
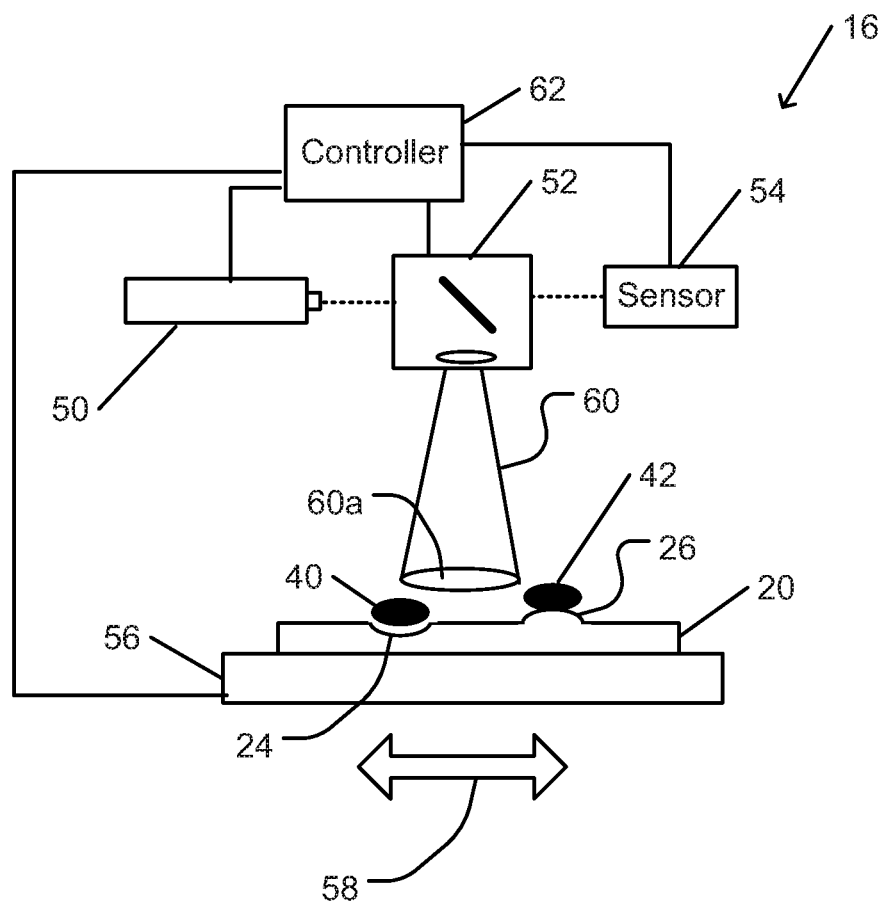
FIG. 3A schematically illustrates an irradiation module of the system of FIG. 1.

FIG. 3A schematically illustrates an irradiation module of the system of FIG. 1.

Irradiation module 16 is configured to irradiate at least a region of substrate 20 that includes defects, such as depression defect 24 and protuberance defect 26, each covered by nanoparticle 40 or 42, respectively.

Radiation source 50 provides radiation for irradiating substrate 20. Typically, radiation source 50 includes a source of femtosecond pulse laser radiation. For example, radiation source 50 may include a Q-switched frequency doubled neodymium-doped yttrium aluminum garnet (Nd:YAG) laser, emitting green pulsed radiation with a wavelength of 532 nm. Other laser or radiation sources that radiate at different wavelengths or in different spectral regions, or other pulsing methods, may be used. Radiation source 50 may emit radiation at a fixed wavelength, at several fixed wavelengths, in a continuum of wavelengths, at a selectable wavelength, or at several selectable wavelengths.

Radiation from radiation source 50 may pass through optics 52. For example, optics 52 may include one or more components for directing radiation (e.g., toward substrate 20), for collimating or concentrating radiation, to enable sampling of radiation, for blocking or allowing passage of radiation, for modulating or adjusting an intensity of radiation, for selecting a wavelength, for filtering, or other manipulation of laser radiation or other radiation from radiation source 50. Optics 52 may include one or more mirrors, lenses, shutters, irises, filters, gratings, prisms, monochromators, apertures, beam splitters, attenuators, actuators (e.g., for moving a mirror, lens, grating, prism, filter, or beam splitter, for adjusting an iris, for activating a shutter, or for moving or adjusting another movable or adjustable component), or other optical components.

Radiation from radiation source 50 may be monitored by radiation sensor 54. For example, radiation sensor 54 may measure a value indicative of radiation intensity, energy density, or another characteristic or property of the radiation. Radiation, or a sample of the radiation, may be directed toward radiation sensor 54 by optics 52 (e.g., by a beam splitter of optics 52), or otherwise.

Optics 52 directs radiation toward substrate 20 in the form of irradiation beam 60. Irradiation spot 60a of irradiation beam 60 impinges on substrate 20. The diameter (or other characteristic size) of irradiation spot 60a is typically much larger (e.g., at least 10 times larger) than a diameter or other lateral dimension of nanoparticle 40 or 42.

Substrate 20 may be mounted on, rest atop, or be held by stage 56. For example, stage 56 of irradiation module 16 may be identical with stage 28 of nanoparticle placement module 14 (FIG. 2), or may represent a different stage, platform, or holder of similar or different structure. Stage 56 may be controlled to effect relative motion, represented by arrow 58, between substrate 20 and irradiation spot 60a.

One or more of radiation source 50, one or more components of optics 52, and stage 56 may be controlled by irradiation controller 62. Irradiation controller 62 may include a processor that is configured to operate in accordance with programmed instructions. Irradiation controller 62 may include or communicate with a memory, data storage device, input device, output device, or another component. Irradiation controller 62 may be identical with, share components with, or communicate with placement controller 30, or may be separate from placement controller 30. Irradiation controller 62 may receive a signal or data from sensor 54. Irradiation controller 62 may control one or more other components of irradiation module 16 on the basis of data from sensor 54.

Irradiation spot 60a may be scanned over the surface of substrate 20. For example, optics 52 may be controlled to move irradiation spot 60a, stage 56 may be controlled to move substrate 20, or both irradiation spot 60a and substrate 20 may be moved in a coordinated manner. The scanning may be in the form of a raster pattern, or in any other suitable scanning pattern.

Irradiation of substrate 20 may repair a defect or a part of a defect, such as depression defect 24 or protuberance defect 26, on which a conducting nanoparticle 40 or 42 has been placed.

According to an embodiment of the invention, conducting nanoparticle 40 or 42 is irradiated in a manner that causes plasma oscillation (of free electrons in the conduction band) within nanoparticle 40 or 42. When the irradiation is near a resonance frequency of the oscillation, large amounts of radiation are absorbed, thus heating and enhancing the local electromagnetic field in the vicinity of nanoparticle 40 or 42.

A wavelength of the irradiation, e.g., as determined by selection or adjustment of radiation source 50, or by selection or adjustment of optics 52, may be selected in accordance with characteristics of nanoparticle 40 or 42. Alternatively or in addition, characteristics of nanoparticle 40 or 42 may be selected in accordance with a wavelength of the irradiation. For example, the combination of irradiation wavelength and selection of nanoparticle 40 or 42 may be selected such that nanoparticle 40 or 42 effectively absorbs the radiation. An absorption cross section (e.g., in units of $cm^2$) resulting from plasma oscillation may be calculated as a function of irradiation wavelength (e.g., in units of nm).

Figure 4:
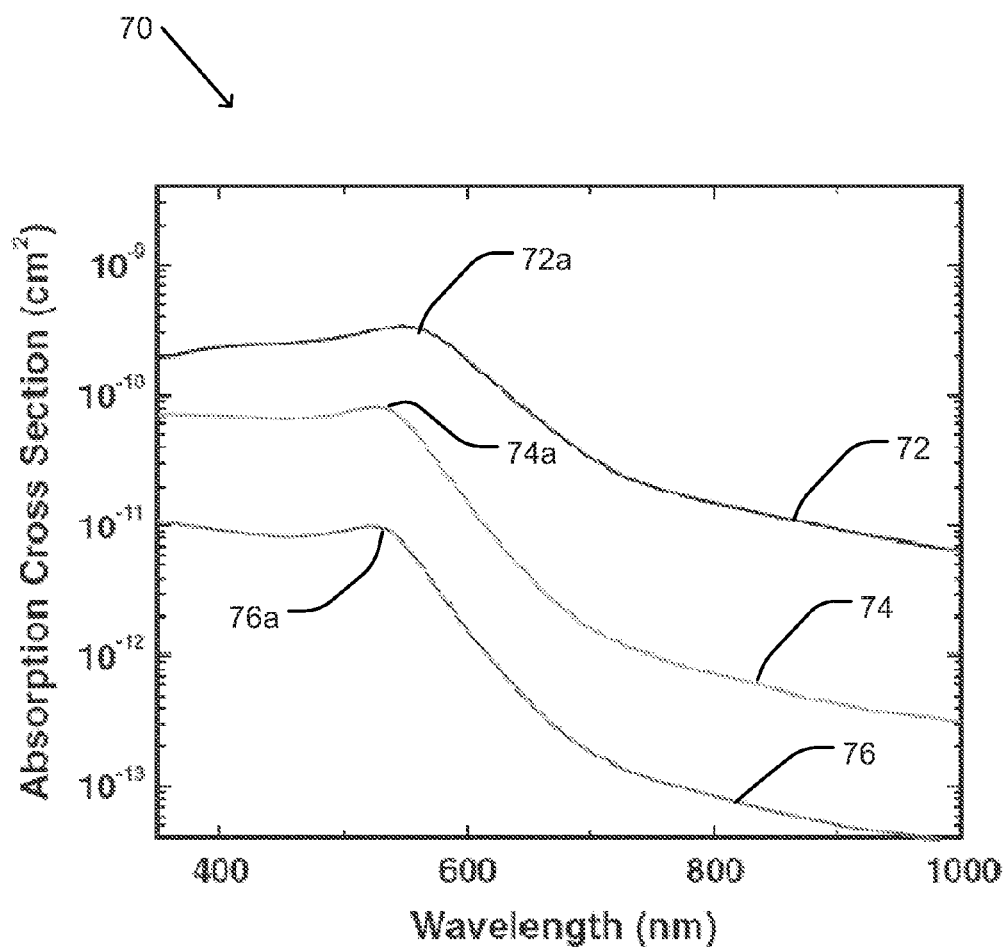
FIG. 4 shows a graph of a result of a calculation for matching a size of a nanoparticle with a radiation wavelength, in accordance with an embodiment of the present invention.

FIG. 4 shows a graph of a result of a calculation for matching a size of a nanoparticle with a radiation wavelength, in accordance with an embodiment of the present invention.

Absorption curves 72, 74, and 76 illustrate a calculated absorption cross section of gold nanoparticles of different sizes as a function of irradiation wavelength. Absorption curve 72 is calculated for a spherical gold particle with a radius of 100 nm, and has a resonance peak 72a. Absorption curve 74 is calculated for a spherical gold particle with a radius of 40 nm, and has a resonance peak 74a. Absorption curve 76 is calculated for a spherical gold particle with a radius of 20 nm, and has a resonance peak 76a. Note that resonance peaks 72a, 74a, and 76a all occur at wavelengths between 500 nm and 600 nm, in the green region of the visible spectrum. Therefore, irradiation module 16 may be configured to irradiate substrate 20 with radiation in the green region of the visible spectrum, or with shorter wavelength radiation.

In some cases, e.g., to reduce or eliminate collateral damage to substrate 20, irradiation wavelength may be selected that is not at a resonance peak. (Similar benefit may result from reducing the pulse duration of the irradiation.)

Referring to FIG. 3A, the heating may deform, soften, melt, or otherwise effect the surface of substrate 20 in the vicinity of nanoparticle 40 or 42, and thus in the vicinity of depression defect 24 or protuberance defect 26. The deformation may thus repair depression defect 24 or protuberance defect 26.

Figure 3B:
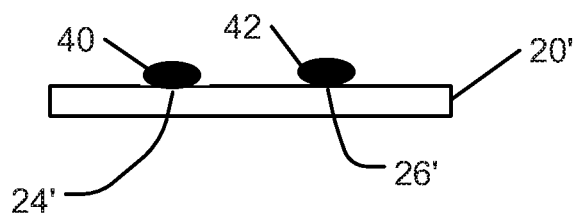
FIG. 3B schematically illustrates defect repair as result of operation of the irradiation module shown in FIG. 3A.

FIG. 3B schematically illustrates defect repair as result of operation of the irradiation module shown in FIG. 3A.

In repaired substrate 20', the repaired defects 24' and 26' are located where depression defect 24 and protuberance defect 26 were present in substrate 20 (FIG. 3A). Repaired defects 24' and 26' may represent substantially flat surfaces, or surfaces that are flatter than the surfaces of depression defect 24 and protuberance defect 26, respectively. For example, irradiation nanoparticles 40 and 42 may have altered the density of material in substrate 20 near depression defect 24 or protuberance defect 26, respectively. The changes in density may have altered (e.g., expand to repair depression defect 24 or soften to repair protuberance defect 26), or may have enabled other forces to alter, the topography of substrate 20 that originally included depression defect 24 and protuberance defect 26 to that of repaired substrate 20'.

Referring to FIG. 1 and FIG. 3B, after irradiation of substrate 20 to form repaired substrate 20', nanoparticle removal module 18 may be operated on repaired substrate 20' to remove nanoparticles 40 and 42. Removal of nanoparticles 40 and 42 from repaired substrate 20' forms output substrate 20". Output substrate 20" includes a substrate surface in which defects have been repaired, and from which nanoparticles have been removed.

Nanoparticle removal module 18 may utilize one or more techniques or technologies in order to remove nanoparticles 40 and 42 from repaired substrate 20'.

For example, nanoparticle removal module 18 may utilize AFM technology to move nanoparticle 40 or 42 from repaired substrate 20'. Nanoparticle removal module 18 may be similar to nanoparticle placement module 14. Nanoparticle removal module 18 may share components with (e.g., AFM device 32, FIG. 2) nanoparticle placement module 14. Nanoparticle removal module 18 may be identical with nanoparticle placement module 14. For example, nanoparticle placement module 14 may be configured to place a nanoparticle 40 or 42 on substrate 20 and to remove the nanoparticle 40 or 42 from repaired substrate 20'.

Alternatively or in addition, nanoparticle removal module 18 may utilize a chemical or other technique or technology to remove the nanoparticle 40 or 42 from repaired substrate 20'. For example, nanoparticle removal module 18 may apply one, or a series, a solvent or reagent to nanoparticle 40 or 42 that dissolves or otherwise removes nanoparticle 40 or 42 while leaving repaired substrate 20' intact.

In accordance with an embodiment of the present invention, surface defect repair may be applied to a substrate that is coated with one or more coating layers. For example, a coated substrate may include an unpatterned multilayer lithography mask.

Figure 5A:
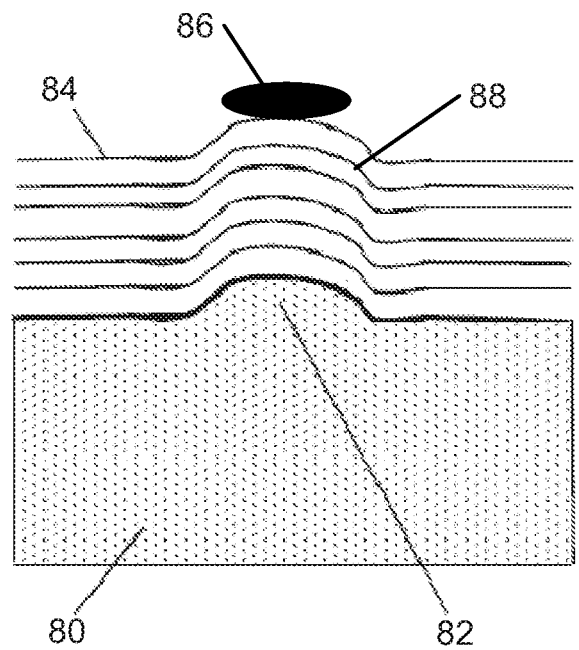
FIG. 5A schematically illustrates a cross section of a layered substrate with a defect.

FIG. 5A schematically illustrates a cross section of a multilayered coated substrate with a defect.

Coated substrate 80 is coated with multilayered coating 84. Although multilayered coating 84 is shown with a plurality of layers, multilayered coating 84, surface defect repair may be applied to a multilayered coating 84 that includes only a single layer. For example, multilayered coating 84 may provide one or more optical (e.g., antireflection or spectrally selective), mechanical (e.g., anti-scratch or adhesion promoting or inhibiting), or chemical (e.g., anti-corrosive) properties to coated substrate 80. Although multilayered coating 84 is shown with a plurality of layers, multilayered coating 84, surface defect repair may be applied to a multilayered coating 84 that includes only a single layer.

Defect 82 in coated substrate 80 causes distortion 88 of multilayered coating 84. In some cases, distortion 88 of multilayered coating 84 may affect one or more properties (e.g., optical properties) of multilayered coating 84 or of coated substrate 80. Surface defect repair, in accordance with an embodiment of the present invention, may be applied to coated substrate 80. Conducting nanoparticle 86 maybe placed on distortion 88 of coated substrate 80. Irradiation of coated substrate 80 may repair defect 86 and distortion 88 of multilayered coating 84.

Figure 5B:
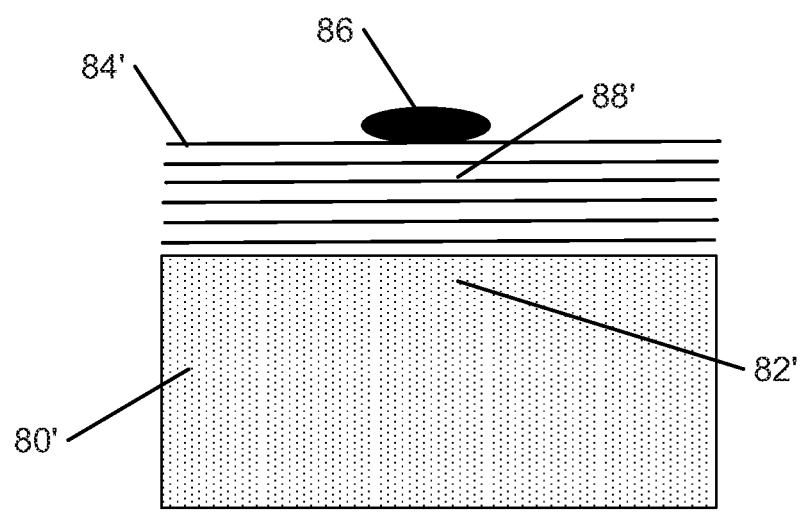
FIG. 5B schematically illustrates the cross section of FIG. 5A after application of surface defect repair in accordance with an embodiment of the present invention.

FIG. 5B schematically illustrates the cross section of FIG. 5A after application of surface defect repair in accordance with an embodiment of the present invention.

Application of surface defect repair may result in repaired coated substrate 80'. In repaired coated substrate 80', repaired defect 82' is substantially flat, or is flatter than original defect 82. Similarly, distortion 88' in repaired coating 84' has been reduced or substantially eliminated. After application of surface defect repair, conducting nanoparticle 86 may be removed.

Application of surface defect repair to a coated substrate may be applicable when heating would not cause mixing between adjacent layers, or otherwise adversely affect the coating. Pulse duration may be adjusted, or properties of a conduction nanoparticle may be selected, to enable application of surface defect repair without adversely affecting the coating.

A system for surface defect repair may operate in accordance with a surface defect repair method.

Figure 6:
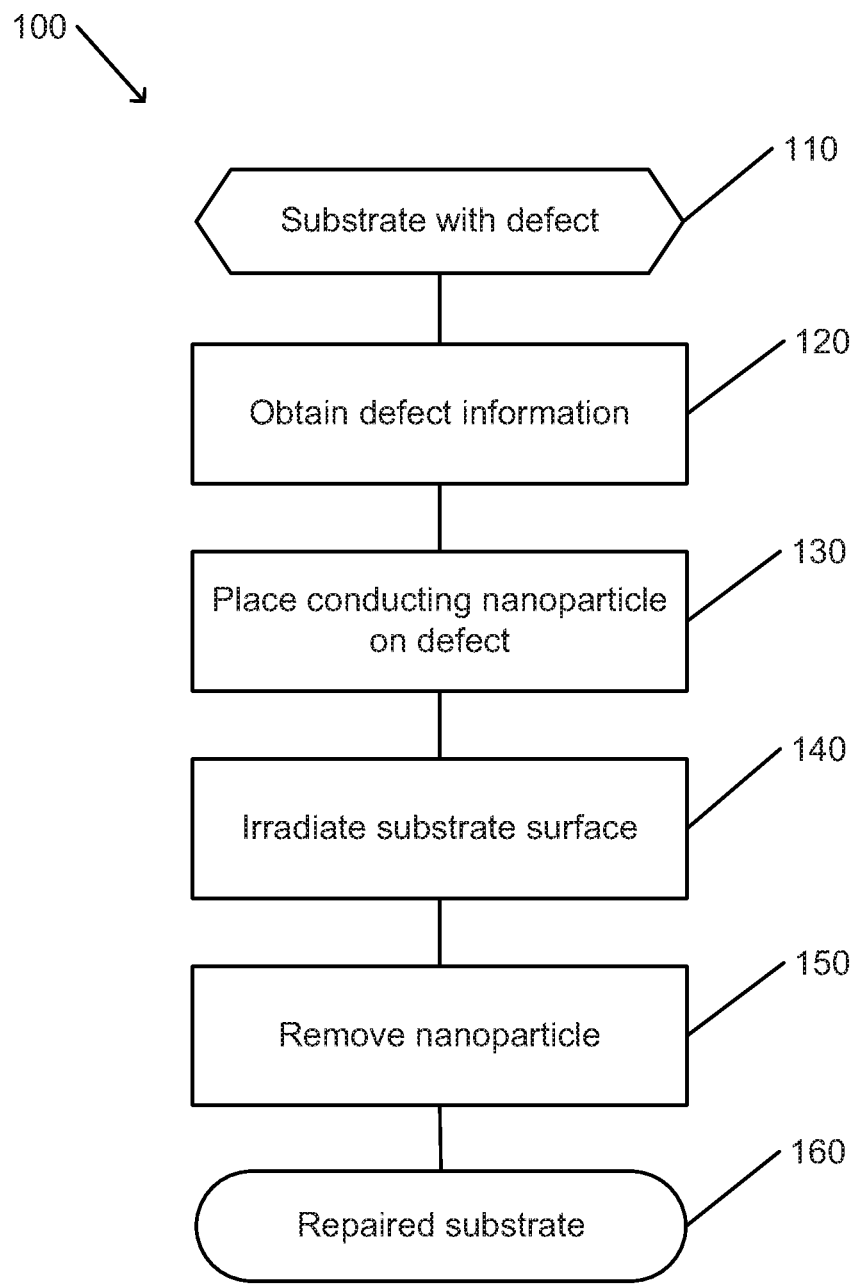
FIG. 6 is a flowchart of a method for surface defect repair, in accordance with an embodiment of the present invention.

FIG. 6 is a flowchart of a method for surface defect repair, in accordance with an embodiment of the present invention.

One or more operations of defect repair method 100 may be executed by a processor or controller of a defect repair system or of a component of the defect repair system. One or more operations of defect repair method 100 may be executed by a plurality of processors or controllers of, or associated with, a defect repair system or component of the defect repair system. One or more operations of defect repair method 100 may be executed by an operator of a defect repair system or of a component of the defect repair system.

It should be understood with respect to any flowchart referenced herein that the division of the illustrated method into discrete operations represented by blocks of the flowchart has been selected for convenience and clarity only. Alternative division of the illustrated method into discrete operations is possible with equivalent results. Such alternative division of the illustrated method into discrete operations should be understood as representing other embodiments of the illustrated method.

Similarly, it should be understood that, unless indicated otherwise, the illustrated order of execution of the operations represented by blocks of any flowchart referenced herein has been selected for convenience and clarity only. Operations of the illustrated method may be executed in an alternative order, or concurrently, with equivalent results. Such reordering of operations of the illustrated method should be understood as representing other embodiments of the illustrated method.

Defect repair method 100 may be executed on a substrate with defects (block 110). For example, the substrate may be mounted or placed on an appropriate stage, platform, or holder of a defect repair system, or of a component of a defect repair system. The surface substrate may have been coated with one or more coating layers.

Information regarding the defects of the substrate (or of a substrate coating) may be obtained (block 120). The information may relate to one or more of a location of each defect, its type (e.g., depression or protuberance), its size, its shape, its height or depth, or other relevant information. For example, previously stored information regarding defects may be retrieved. Information regarding defects may be acquired through measurements, e.g., via optical or AFM scanning of the surface. Information regarding distortion of an optical coating may be obtained via optical measurements on the coated substrate.

A conduction nanoparticle may be placed on a defect (block 130).

A nanoparticle may be selected for placement based on one or more of a composition of the nanoparticle, its size (e.g., of one or more dimensions), its shape, or other properties of the nanoparticle. A property of the nanoparticle may be selected in accordance with a property of the defect (e.g., a size or shape of the defect in order that the selected nanoparticle may properly cover the defect), or a property of irradiation that is to be applied (e.g., so as to match a plasma oscillation resonance frequency of the nanoparticle to a wavelength of the irradiation, or to match heating properties of the nanoparticle to a pulse duration or frequency of the irradiation so as to achieve a desired heating, near-field enhancement, or level of collateral damage).

The nanoparticle may be placed on the defect using an AFM technique, or another technique.

The substrate surface upon which nanoparticles have been placed is irradiated (block 140). The irradiation is configured to repair a substrate defect or coating distortion that is covered by a nanoparticle.

The irradiation may include laser pulses of femtosecond duration. The irradiation beam may be characterized by a spot size that is much (e.g., ten times) larger than a dimension of the nanoparticle. The beam may be scanned across the substrate surface in order to ensure that all parts of the substrate surface, including all defects upon which nanoparticles had been placed, are irradiated. A wavelength of the irradiation may be selected in consideration of a resonance frequency of the nanoparticles. A pulse energy density may be selected to be below a modification threshold of the substrate surface to avoid excessive heating of any part of the substrate surface that is not covered by a nanoparticle while sufficiently heating covered defects so as to repair the defects.

After irradiation, the nanoparticle may be removed from the surface (block 150). For example, AFM manipulation may be applied to remove the nanoparticle. Alternatively or in addition, chemical treatment may be used to remove the nanoparticle.

The result of execution of defect repair method 100 is a repaired substrate (block 160). In the repaired substrate, the depth (e.g., of a depression defect) or height (e.g., or a protuberance defect) of a repaired defect (or part of the defect) is less than the depth or height of the defect (or part of defect) prior to repair.

The invention claimed is:
1. A method for repairing a defect on a lithography mask substrate surface, the method comprising:
  placing on the defect a nanoparticle comprising a conductive material;
  irradiating a region of the lithography mask substrate surface in which the nanoparticle is placed, the region being larger than the nanoparticle, an energy density of the irradiation being below a modification threshold for the lithography mask substrate surface; and
  locally heating the lithography mask substrate using the irradiated nanoparticle to repair the defect, in which a portion of the lithography mask substrate in a vicinity of the irradiated nanoparticle is heated above the modification threshold.

2. The method of claim 1, wherein the conductive material comprises gold.

3. The method of claim 1, further comprising measuring a position of the defect and wherein placing the nanoparticle comprises placing the nanoparticle at the measured position of the defect.

4. The method of claim 3, wherein measuring the position of the defect comprises optical scanning of the substrate surface.

5. The method of claim 1, wherein placing the nanoparticle comprises manipulating the nanoparticle using an atomic force microscope device.

6. The method of claim 1, wherein placing the nanoparticle comprises selecting a size of the nanoparticle in accordance with a measured size of the defect or in accordance with a wavelength of the irradiation.

7. The method of claim 1, wherein a lateral dimension of the nanoparticle is no larger than a lateral dimension of the defect.

8. The method of claim 1, wherein the lithography mask substrate comprises a photo lithography mask substrate or an unpatterned multilayer lithography mask substrate.

9. The method of claim 1, wherein the irradiation comprises pulsed laser radiation.

10. The method of claim 9, wherein a duration of a pulse of the radiation is less than 100 femtoseconds.

11. The method of claim 9, wherein a pulse energy density of the irradiation is below the modification threshold.

12. The method of claim 1, wherein a spot diameter of the irradiation is at least ten times larger than a lateral dimension of the nanoparticle.

13. The method of claim 1, wherein a wavelength of the irradiation is selected in accordance with a resonance frequency of a plasma oscillation in the nanoparticle.

14. The method of claim 1, further comprising removing the nanoparticle from the lithography mask substrate surface.

15. The method of claim 14, wherein removing the nanoparticle comprises manipulation using an atomic force microscope device.

16. A system for repairing a defect on a lithography mask substrate surface, the system comprising:
  a placement device for placing a nanoparticle at a location on the lithography mask substrate surface; and
  an irradiation device controllable to direct radiation from a radiation source to a region of the lithography mask substrate surface on which the nanoparticle is placed, the region being larger than the nanoparticle, and an energy density of the radiation being below a modification threshold for the substrate surface, in which the system is configured to locally heat the lithography mask substrate using the irradiated nanoparticle to repair the defect, in which a portion of the lithography mask substrate in a vicinity of the irradiated nanoparticle is heated above the modification threshold.

17. The system of claim 16, wherein the radiation source comprises a pulsed laser radiation source to produce pulses of the radiation, wherein a duration of each of the pulses is less than 100 femtoseconds.

18. The system of claim 16, wherein optics or a stage of the irradiation device is controllable to scan a beam of the radiation across the substrate surface.

19. The system of claim 18, wherein a diameter of an irradiation spot of the beam is at least ten times larger than a lateral dimension of the nanoparticle.

20. The system of claim 16, wherein the placement device comprises an atomic force microscope device.

21. A system for repairing a defect on a substrate surface, the system comprising:
- a placement device configured to place a nanoparticle at a location having the defect on the substrate surface;
- an irradiation device controllable to direct radiation from a radiation source to a region of the substrate surface on which the nanoparticle is placed, the region being larger than the nanoparticle, and an energy density of the radiation being below a modification threshold for the substrate surface; and
- a removal device configured to remove the nanoparticle from the substrate surface, the removal device using at least one of atomic force microscopy technology or chemical technology to remove the nanoparticle from the substrate surface.

22. The system of claim 21 in which the placement device and the removal device share an atomic force microscopy device.

* * * * *